United States Patent

Moll

[11] Patent Number: 6,045,667
[45] Date of Patent: Apr. 4, 2000

[54] PROCESS AND SYSTEM FOR THE TREATMENT OF SUBSTRATES USING IONS FROM A LOW-VOLTAGE ARC DISCHARGE

[75] Inventor: Eberhard Moll, Berlin, Germany

[73] Assignee: Dr. Eberhard Moll GmbH, Berlin, Germany

[21] Appl. No.: 09/097,636

[22] Filed: Jun. 16, 1998

[30] Foreign Application Priority Data

Jun. 16, 1997 [DE] Germany ............................ 197 25 930

[51] Int. Cl.⁷ .................................................. C23C 14/34
[52] U.S. Cl. ............................... 204/192.38; 204/298.41; 204/192.16; 204/192.12; 204/192.34; 204/192.32; 204/298.31; 204/298.36; 204/298.07; 204/298.15; 204/298.16; 204/298.17
[58] Field of Search ......................... 204/298.41, 192.38, 204/192.16, 192.12, 192.32, 192.34, 298.31, 298.36, 298.07, 298.15, 298.16, 298.17

[56] References Cited

U.S. PATENT DOCUMENTS

| | | | |
|---|---|---|---|
| 4,197,175 | 4/1980 | Moll et al. | 204/298.41 |
| 4,254,159 | 3/1981 | Pulker et al. | 204/192.38 |
| 5,384,018 | 1/1995 | Ramm et al. | 204/192.38 |
| 5,690,796 | 11/1997 | DuPont et al. | 204/192.38 |
| 5,709,784 | 1/1998 | Braendle et al. | 204/192.38 |

FOREIGN PATENT DOCUMENTS

| | | |
|---|---|---|
| 306612 | 3/1989 | European Pat. Off. . |
| 2823876 | 1/1979 | Germany . |
| 29615190 | 1/1997 | Germany . |

*Primary Examiner*—Alan Diamond
*Attorney, Agent, or Firm*—Oblon, Spivak, McClelland, Maier & Neustadt, P.C.

[57] ABSTRACT

A process and system for the treatment of substrates using ions from a low-voltage arc discharge. Before coating with an anti-wear layer, the substrates are etched by ion bombardment in order to enhance the adhesion of the anti-wear layer, and the layer which is growing is influenced during the coating by ion bombardment in order to improve the elastic behavior of brittle hard-material layers. The process increases the capacity of the plasma of a low-voltage arc discharge to penetrate the three-dimensional structures of tools, machine parts and items of practical use, and thus effects more uniform treatment by the ion bombardment and therefore better layer properties in indentations. A prerequisite is a hollow substrate arrangement in which the discharge is not prevented from spreading to the substrates. The process, and the system suitable therefore, can be combined with many PVD coating sources, for example with arc sources, cathodic sputtering sources, or a low-voltage arc source.

30 Claims, 1 Drawing Sheet

PROCESS AND SYSTEM FOR THE TREATMENT OF SUBSTRATES USING IONS FROM A LOW-VOLTAGE ARC DISCHARGE

CROSS REFERENCES TO RELATED APPLICATIONS

This application claims priority to DE 19725930.8-45 filed Jun. 16, 1997, incorporated herein by reference.

BACKGROUND OF THE INVENTION

1. Field of the Invention

The present invention relates to a process for the treatment of substrates using ions from a low voltage arc discharge. The process is used to prepare objects for a coating process, and to influence the layer growth during the application of the layer. The objects are referred to below as substrates. The process according to the invention is suitable in particular for the treatment of three-dimensionally structured substrates, for example for the treatment of tools, machine components or items of practical use before and during coating with an anti-wear layer.

2. Discussion of Background

Anti-wear layers usually consist of nitrides, carbides or carbonitrides of the transition elements of the 4th, 5th and 6th groups of the Periodic Table. The term transition element is used to denote the elements of the subgroups in the 3rd, 4th and 5th periods. It is also customary to use dry lubrication layers, for example layers of molybdenum sulphide, as a cover layer over a hard-material layer. Hard carbon layers, preferably containing metal and hydrogen, are applied to machine components.

Vacuum coating processes, in which at least one layer-forming species of atom is brought into the treatment space by atomization from the condensed phase, are referred to as physical vapor deposition (PVD) processes. The most important PVD processes are vacuum evaporation and cathodic sputtering, hereafter abbreviated to sputtering. The reactive evaporation and sputtering processes defined in the next section are also counted as PVD processes, in spite of the chemical reactions which they involve.

It is customary to heat the substrates before coating, in order to remove adsorbed gases and vapors, but heating may lead to the production of oxides. Oxide skins with a thickness of the order of a quarter of the wavelength of light (about 0.1 mm) can be seen with the naked eye as so-called tarnishing colors.

In order to remove oxide skins and other invisible surface coats from the surfaces of the substrates and their holders, the substrates are bombarded with positively charged ions. The material at the surfaces is in this case removed by sputtering and distributed on the walls and the supports, as well as on the substrates. The balance for the substrates is negative, that is to say a reduction in weight can be measured after the ion bombardment. It is therefore legitimate to refer to this treatment as "etching". The expression "cleaning" would only be justified with the reservation that a thin mixed layer is produced by sputtering around the surface layers, the substrate material, and the layer material existing on the holders as a result of the previous batch. This layer seems to improve the adhesion of the subsequently vacuum evaporated layer. This etching is a treatment in the sense of the present invention.

In particular in mechanical applications, very great requirements are made not only of the adhesion, but also of the elasticity of the layer. These requirements can be satisfied according to the invention by ion plating (IP). We use this expression for treatment by bombardment of the growing layer during the coating with ions. It condenses the layer and leads to a quite desirable internal compressive stress in the layer. Ion plating is also a treatment in the sense of the present invention.

A low-voltage arc is a gas discharge between a hot cathode, arranged in a chamber which is separated from the anode space but connected to it through an opening, and an anode. During operation, a noble gas is continuously introduced into the hot cathode chamber, and the anode space is kept under a sufficient vacuum for the intended process by pumping.

A known process for the treatment of substrates by means of ions from a low-voltage arc discharge is described in German patent 2823876. It is an evaporation method, in which the material to be evaporated is bombarded with electrons from the low voltage arc discharge.

In this process, the material to be evaporated is connected as the anode of the low-voltage arc discharge. This makes the anode space the evaporation space. In the evaporation space, the discharge pinched through the opening is additionally guided onto the anode by a magnetic field, which also focuses it (in order to achieve a sufficient power density on the surface of the anode for the evaporation). The material which evaporates is contained as a liquid melt or as a subliming granulate in an upwardly open cooled crucible. The guiding and focusing is brought about by a magnetic field whose field lines run parallel to the discharge and guide the discharge onto the crucible from above. This magnetic field is usually produced by a magnetic coil or pair of magnetic coils. The axes of these coils are in this case usually directed perpendicularly onto the crucible.

The substrate support customarily consists of rotatable substrate holders, or "trees". They are arranged around a circle in such a way that they form an axisymmetric cavity. The path of the magnetically focused low-voltage arc discharge runs through this cavity, predominantly along the axis. With an axisymmetric arrangement of this type, it is enough to rotate the trees about their own axes in order to achieve the uniform treatment. It is not necessary to rotate the entire substrate support about the axis of the cavity in carousel-fashion. However, if the intention is for it to be possible to use sources whose action is not axisymmetric, for example arc sources or cathodic sputtering sources located outside the cavity, then it is known to have the trees rotate both about the aforementioned carousel axis and about the tree axis (see, for example, EP 306612).

The process according to DE 2823876 is suitable for the production of nitrides, carbides or an carbonitrides by activated reactive evaporation (ARE) from metal vapor. The latter is activated by the electrons of low-voltage arc discharge to such an extent that, from the outset, the pure metal is evaporated and all nitrogen and/or carbon atoms are drawn from a gas. If ARE is combined with IP, then this results in activated reactive ion plating (ARIP). This involves more than just extra advantages, since not only noble gas ions, but primarily ions of the coating material are available for the ion plating.

The advantage of the known process is, last but not least, that it allows ion plating with metal ions and ion etching with noble gas ions. During etching, the substrates are preferably bombarded with argon ions, which are produced in the low-voltage arc discharge. By applying a negative bias voltage, ions diffusing out of the plasma of the low-voltage discharge are accelerated in an electric field in direction of the substrates.

The disadvantage of the known process is the fact that it is limited to metals which evaporate or sublime at temperatures below about 1700° C. Titanium and chromium are the most important metals which can be evaporated from a crucible using a low-voltage arc. A further disadvantage of this process is that it is restricted to pure metals. The stoichiometric evaporation of alloys, for example titanium/ aluminum for the production of TiAlN layers, leads to difficulties.

In terms of their advantages and disadvantages, arc sources are comparable with low voltage arc sources. Although they can evaporate alloys and make it possible to ion-plate with metal ions, they nevertheless only make it possible to etch with metal ions. Etching with noble gas ions has, however, proved unequivocally superior to etching with metal ions. The successful introduction of ternary and antiwear layers made of alloys such as TiAlN brought with it the desire to equip arc source systems with a low-voltage arc for etching, in order to combine the advantages of these methods. A combination of this type, and its advantages over conventional metal ion etching, are described in the utility model DE 29615190.

According to DE 29615190, the low-voltage arc discharge does not penetrate the central cavity, formed by the substrates, but burns in a special discharge chamber on the outer wall of the treatment chamber. An arrangement of this type is intended to avoid limiting the economic viability of the above-described process according to DE 2823876. Quote: "This restriction is due to the fact that the low-voltage arc discharge, which penetrates the treatment chamber centrally, takes up a certain amount of space for itself, and in order to keep high-quality reproducible results, the workpieces need to have a corresponding separation from the discharge, with the result that a fairly large part of the central space of the treatment chamber cannot be used." A separation of from 15 to 25 cm is recommended for the novel etching device.

The etching device according to DE 29615190 has a great disadvantage in that the improvement in economic viability which is aimed for in the utility model is not achieved in practice. The reason is the risk of sparks being produced and leaving behind trails on the substrates. If the intention is to avoid defects of this type, only an ion current of limited strength should be applied to the substrates.

SUMMARY OF THE INVENTION

The present invention not only solves the above-noted problems, but also achieves the following, substantially more extensive object:

Providing a low-voltage arc discharge device which is suitable for (1) combination with a variety of types of coating sources, (2) fine-structured 3-dimensional substrates, and (3) short etching phases.

This object is achieved according to the invention in that, as in the process according to DE 2823876, the substrates are arranged around a cavity and are treated using ions from a low-voltage arc discharge which extends from a hot cathode in a chamber, through an opening into the treatment space and there into the cavity as far as an anode. In this case, noble gas is introduced continuously into the hot cathode chamber during operation and a vacuum which is sufficient for the intended treatment process is maintained in the treatment space by pumping. However, in contrast to the process according to DE 2823876, the plasma of the discharge which is pinched through the opening is not prevented from spreading in the cavity as far as the substrates.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
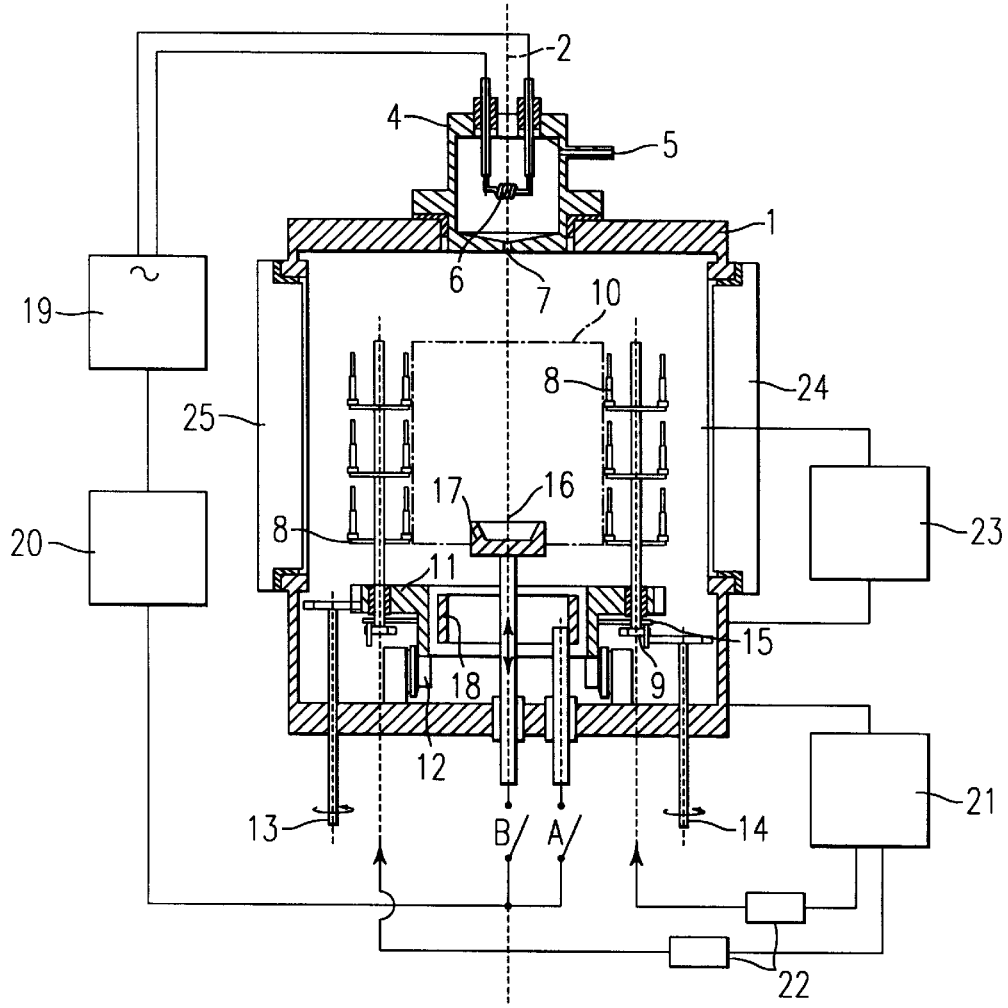
FIG. 1 is a side view of the system for implementing the process for treatment of substrates using ions from low-voltage arc discharge, according to the invention.
Figure 2:
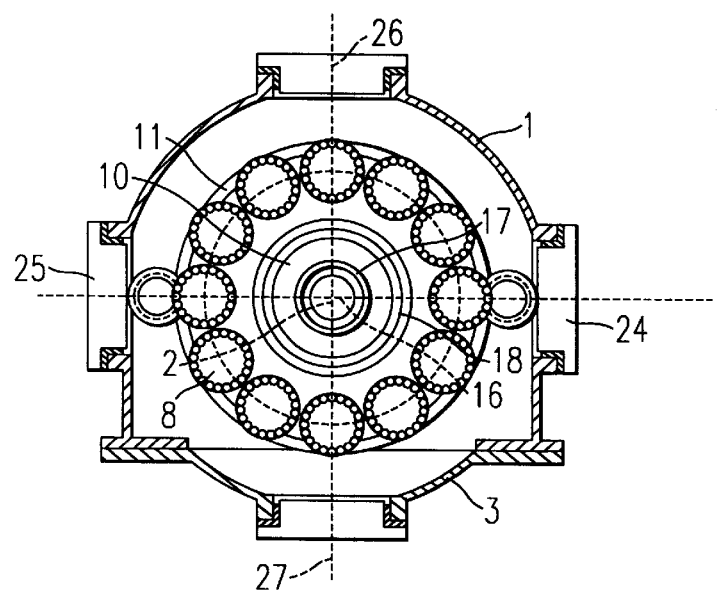
FIG. 2 is a top view of the system of FIG. 1.

Referring now to the drawings, wherein like reference numerals designate identical or corresponding parts throughout the several views, and more particularly to FIGS. 1 and 2 thereof, there is illustrated a system for implementing the process for treatment of substrates using ions from low-voltage arc discharge, according to the invention.

The customary method of preventing a gas discharge from spreading involves a magnetic field whose field lines run parallel to the discharge. Such a field, with flux density B, constrains electrons (mass m, elementary charge e) with a radial velocity component $V_r$ to helical paths with the radius $r=(m \times V_r)/(e \times B)$. An alternative method would be to use a guide tube with negatively charged walls or with electrically insulating or insulated walls, which automatically become negatively charged by the plasma. For the sake of completeness, the focusing effect of the magnetic field produced by the plasma current itself (pinch effect) should also be mentioned. This effect cannot in principle be avoided, but when there is no magnetic focusing, it has no demonstrable effect in the context described here. The field strength of magnetic fields whose field lines run parallel to the low-voltage arc discharge should be less than 0.0005 tesla.

The avoidance according to the invention of any avoidable hindrance to the spreading of the plasma to the substrates has the effect that, if they are sufficiently negatively charged relative to the plasma or at least are electrically insulated, the substrates forming the cavity themselves form these walls. This makes the cavity a kind of plasma bottle. The spreading of the low-voltage arc discharge can be observed through a window in the vacuum container when the focusing magnetic field is switched off.

If the current of the low-voltage arc discharge is sufficient, the plasma penetrates the three-dimensional structures of the substrate support and the individual substrates. As a consequence of this, a more uniform surface treatment is achieved when etching and ion-plating complexly shaped substrates. This advantage can be seen with the naked eye when observing substrates which exhibit tarnishing colors after heating. If the penetration capacity of the plasma is insufficient, the tarnishing colors of the unetched oxide layers can be seen after etching at the bottom of drilling grooves or other indentations. They cause the adhesion of the layers deposited thereon to be unsatisfactory.

The practical observation that the penetration capacity can be a critical quantity is supported by the following theoretical consideration:

The distance from which ions are extracted from a plasma and accelerated onto the substrates can be estimated using the Schottky-Langmuir space charge formula (see, for example, the text book Gertheen, Kneser, Vogel: Physik, 15th Edition, page 431, formula 8.30). It gives the space charge-limited current density j as a function of the extraction distance d and the difference U between the electrode and plasma potentials. For a planar electrode:

$$d^2 = 4/9 \times e_o \times (2e/M)^{1/2} \times U^{3/2}/j$$

with $e_o$=dielectric constant and e=elementary charge.

In the process according to the invention, the extraction distance calculated with this formula is less than 1 mm. On account of the complicated geometry, it is at best a realistic estimate. The relative values calculated with the Schottky-Langmuir space charge formula are very much more meaningful. The calculation shows, in particular, the effect of an increase in the substrate current density on the capacity of the plasma to penetrate the geometrical structures: for a given power, the extraction distance decreases superproportionally as the current density increases. For example, when the current density is doubled and the voltage is halved, an extraction distant which is less by a factor of 2.4 is obtained in spite of an equal etching rate. This is an important advantage with deep and fine structures, as occur, for example in twist drills, taps, milling cutters as well as pressing and punching tools.

An explanation is given below of how the process according to the invention can not only improve quality but also increase the etching rate.

Sparks are arc discharges. Unlike glow discharges, they do not cover an extended cathode surface, but use a small, hot, continuously moving cathode spot. The properties of sparks are therefore determined not by the current density but by the total current. The probability of a spark discharge being ignited increases strongly as the total current onto the substrates rises. There is therefore a current limit at about 10 A which should not be exceeded. When the etching current is distributed over parts of the substrate support, this current limit no longer holds for the total current, but for the current onto the individual parts. The desired increase in the etching power, with the associated reduction in the length of the etching phase, can be achieved by distributing the etching current over all the individual trees/substrate holders and by using current-limiting cutouts in the lines to the individual trees. The achievable improvement factor corresponds to the surface area ratio between the inside of the cavity and the externally applied etching device.

It is noteworthy that the objects of the invention were achieved precisely by not adhering to the teaching formulated in German patent 2823876, which was hitherto generally accepted and adhered to in practice. Namely, in that the low-voltage arc discharge pinched through the opening of the chamber is, in the evaporation space, neither additionally guided by a magnetic field onto the anode nor (in order to achieve a sufficient power density for the evaporation) focused onto the surface of the anode by a magnetic field. Furthermore, the requirement established in German utility model 29615190 for a distance between the substrates and the discharge is, by the present invention, not only typically not adhered to, but typically turned around.

During trials of the evaporation of material using the unfocused low-voltage arc according to the invention, the latter was supplied from a high performance power source in order (according to accepted teaching) to achieve the power density needed for a sufficient evaporation rate. It was found in these trials that an unexpectedly small increase in the power of the low-voltage arc is sufficient to achieve the same evaporation weight as with the focused low-voltage arc. The power density, calculated by dividing the total power of the low-voltage arc discharge by the surface area, acting as an anode, of the crucible and the material which it contains, is in this case considerably less than 10 MW/m$^2$ (=1 kW/cm$^2$), i.e. more than a factor of 10 less than the lower limit of 10 kW/cm$^2$ specified in German patent 2823876.

The surprise over this result was further increased by the apparently particularly unfavorable geometrical conditions under which the trials were carried out: The distance between the opening and the material to be evaporated can, without detrimental consequences, be increased up to the geometrically determined limits (0.7 m) of the available system, a distance which has hitherto been regarded as possible only with magnetic guiding.

Further advantages result as a direct consequence of the absence of the magnetic field, and therefore the elimination of the following three problems:

(1) The magnetic field causes permanent magnetization on substrates made of ferromagnetic materials, for example tools made of steel and hard metal. After coating, substrates of this type need to be demagnetized in an additional working step. In the case of lightweight substrates, it is even possible that they will be pulled out of their holders by the magnetic field. A further problem is the feedback of magnetizable substrates on the profile of the magnetic field, and therefore the profile of the low-voltage arc discharge.

(2) Props made of magnetically permeable steel which are vertical and therefore parallel to the field lines, can lead to attenuation and/or distortion of the magnetic field. These parts of the substrate support must therefore be made from austenitic steel, which is more expensive and more difficult to process. Since, in industry, substrate supports are used in a wide variety of contexts, and often need to be manufactured on at short notice, this disadvantage is one which has economic impact.

(3) The magnetic coils themselves are also a problem. They are usually fitted outside the vacuum container. However, external magnetic coils are correspondingly large and therefore substantially dictate the design of the system, in particular the vacuum container. Systems for carrying out the known process according to DE 2823876 therefore usually have a design which is unusual for PVD systems: a cylindrical container which has a vertical axis and is surrounded by magnetic coils, and in which the often very heavy substrate holders are arranged on a lowerable base which, in the lowered position, can be moved horizontally. Magnetic coils fastened inside the vacuum container, as proposed in German patent 3615361, would also permit the use of containers with a front door. Although coils of this type have smaller dimensions, the outlay associated with them is greater than in the case of external magnetic coils, on account of the required high-vacuum compatibility or high vacuum-tight encapsulation of the coils. Furthermore, internal coils either prevent the vapor from spreading or lead to the size of the container being increased.

The elimination of the 3rd problem is particularly important. The technical progress resides in this case less in saving the outlay on the coils (including the supply unit and control system), than in the gain in freedom when designing a new system. One benefit is, for example, the possibility of use of a vacuum container with a front door. Front doors have the advantage that they can be integrated in a wall. By virtue of this measure, the oil-free, but often dusty workplace of the coater is separated from the maximally dust-free, but not oil-free machine space. Even when flange openings need to be made on the walls of the container, for example, for arc sources or cathodic sputtering sources, it is very helpful if the system does not also need to be surrounded by coils.

Examples of preferred embodiments of the process according to the invention will be described below. These process examples are carried out in a preferred version of the system according to the invention which is chosen as an example. The FIGS. 1 and 2 show respective schematic representations of a side and top view of the system according to the present invention.

In FIGS. 1 and 2, the vacuum container 1 has the shape of a cylinder around a vertical axis 2. It has a front door 3 fitted over its full width and height. The system does not have any coils for producing a magnetic field with field lines directed parallel to the axis 2. The interior of the vacuum container 1 is the treatment space. It has a diameter of 0.9 m. Heating radiators are fastened on the inner walls of the container 1 and the door 3. They are not represented in the drawing, neither is the high-vacuum pump. The cathode chamber 4 with the noble gas inlet 5 can be seen at the top on the vacuum container 1. The cathode chamber contains the hot cathode 6, namely a wire heated by means of an electrical feed-through. The inside of the cathode chamber 4 is connected to the treatment space through an opening 7.

The substrate support comprises 12 substrate holders 8, of which only the substrate holders located in the section plane are shown in the side view FIG. 1. Each substrate holder is mounted with electrical insulation. In practice, they are usually vertical shafts with parts fitted on to accommodate substrates. The substrate holders 8 are for this reason referred to as trees. Each tree has an insulated gear 9 and can rotate about its own axis. The 12 substrate holders 8 are arranged in a circle around the axis 2, and together form an axisymmetric substrate arrangement around an axisymmetric cavity 10. Instead of the 12 trees 8 with 130 mm diameter, 6 circularly arranged trees with 260 mm diameter could also form the cavity 10. The vertical axis of the cavity 10 formed by the substrate arrangement 8 is identical to the axis 2 of the cylindrically shaped part of the vacuum container 1.

The part 11 of the substrate support which can be rotated about the axis 2 is referred to as the carousel. It contains the insulating mounts and the electrical supplies (not shown) to the trees. The carousel is mounted on rollers 12 and is driven via the shaft 13 using a gear. The rotation of the carousel serves (1) to balance out azimuthal asymmetries in the plasma density or in he geometry of the source arrangement, (2) to drive the trees via the toothed ring 15 and the gears 9, and (3) to carry the trees past the door opening for loading and unloading.

If the shaft 14, and therefore also the toothed ring 15, are kept fixed, then the rotational movements of the carousel and the trees are coupled. If, however, the shaft 13 is fixed and the shaft 14, and therefore also the toothed ring 15, are rotated, then the carousel is stationary and the trees rotate only about their own axis. If both shafts are rotated, the rotational movements of the carousel and the trees can be arbitrarily adjusted.

In the central region of the cavity 10 formed by the twelve holders, a vertically displaceable, water-cooled, electrically insulated evaporator crucible 16 is fitted in the region of the axis 2. Its distance from the opening 7 of the cathode chamber 4 can be varied over the entire height of the substrate support and further. The crucible 16 is open at the top and is filled with the material to be evaporated. The side surfaces 17 of the crucible and the rod for displacing it are shielded against the low-voltage arc plasma by floating-potential tubes which move with them. The shielding limits the electron bombardment of the material to be evaporated. Although typically essential, it has not been represented for the sake of simplicity. The crucible, with its tubular shield, is surrounded at the lower end of the cavity 10 by a stationary electrode 18. The latter is used during inactivated ion plating with noble gas ions, as the anode of the low-voltage arc discharge.

The hot cathode 6 is heated using alternating current until it is typically white hot. This current is produced by the supply unit 19, which forms part of the ungrounded low-voltage arc circuit with the DC supply unit 20. It delivers up to 420 A. Either the etching anode 18 or, if material is to be evaporated from a crucible, the crucible 16 may be used as the anode of the low-voltage arc discharge. During etching, switch A is closed, and switch B is closed during evaporation.

Using the supply unit 21, the substrate holders are brought to a negative potential in order to produce a bias voltage between the substrates and the plasma. During etching, this voltage is about 200 V, and has a lower value during coating. The substrate potential is, separately for each tree, applied firstly to the carousel via slip rings (not shown) and from there to the trees. Each of the 12 lines contains an electronic cutout 22.

The supply unit 23 supplies the laterally flanged-mounted coating source 24. If the source 24 is an arc source, the supply unit 23 delivers, for example, 300 A at a discharging voltage of about 20 V. If it is a cathodic sputtering source the supply unit 23 delivers, for example, 20 A at a discharge voltage of about 400 V. The coating sources 25 to 27 each have their own supply unit (not shown).

EXAMPLE 1

The first example describes an etching process, that is to say a substrate treatment according to the invention by bombardment with noble gas ions from a low-voltage arc discharge before coating.

The substrates are drills with 6 mm diameter made of high-speed steel (HSS) or hard metal. Three round discs, with tubes in between as spacers, are fitted on the trunks of the trees 8. The discs are provided at their periphery with 20 parts each for accommodating individual drills. The drills are fitted upright (like candles) in the 12×3×20=720 accommodating parts which can be rotated about their vertical axes, then the container door 3 is closed and the container 1 is pumped free of air using vacuum pumps.

After a residual gas pressure of 0.003 Pa is reached, the tools are heated in known fashion using heating radiators to a temperature of 400° C., in order to accelerate the resorption of water molecules and air molecules.

During etching, an argon flow of 0.133 Pa×m$^3$/s (i.e., 80 sccm, sccm=standard cubic centimeters per minute) is maintained through the line 5 into the cathode chamber 4, and from there through the opening 7 into the interior of the container 1. Argon is pumped out of the container using a high-vacuum pump. In steady state, this leads to a pressure drop from the cathode chamber to the interior of the container 1. The argon pressure in the container 1 is 0.127 Pa.

The low-voltage arc discharge can be ignited if (1) the hot cathode 6, heated using the supply unit 19 through direct electrical feed-through, is at high temperature, (2) the crucible 16 is down, and (3) the switch A is closed. On its way from the hot cathode 6 to the electrode 18 which serves as the anode, the low-voltage arc discharge passes through the cavity 10 of the substrate arrangement and fills it with its plasma. The current is 280 A and the discharge voltage is 39 V.

The low-voltage arc circuit is at floating potential. The hot cathode 6 is in this case at about −19 V and the anode 18 at about +20 V. The plasma potential of the low-voltage arc discharge in the cavity 10 is at approximately 0 V. These, and subsequent potentials are always given with respect to the potential of the grounded container 1.

The substrate holders with the drills are placed at a potential of −200 V using the supply unit 21. This gives, relative to the plasma, a bias voltage of −200 V which extracts positive argon ions diffusing out of the plasma and accelerates them to the substrates. The substrate current is substantially independent of the bias voltage, but strongly dependent on the arc current. For an arc current of 280 A, a substrate current of about 1.8 A is measured for each tree. This makes a total of 21.6 A. The etching phase lasts 15 minutes. Sparks are not observed.

For a bias voltage of −200 V, the kinetic energy of the argon ions accelerated in the direction of the substrates is about 200 eV, and the power imparted to the substrates and their support by ion bombardment is 4.32 kW. Further to the etching, this power causes additional heating of the substrates from 400° C. to about 420° C.

The etching phase is terminated by switching off the supply units 20 and 19 of the low-voltage arc, and by switching off the argon feed. The parameters used in this example lead to a good etching result. If the process is terminated after the etching, no tarnishing colors due to unetched oxide layers can be seen in the drilling grooves. The coated drills also do not exhibit any flaking in their grooves.

These observations are supported by an estimate of the extraction distance for ions from a plasma. The Schottky-Langmuir space charge formula gives an extraction distance $d \gg 0.78$ mm for argon ions of mass $M = 40 \times 1.67 \times 10^{-26}$ kg $= 6.7 \times 10^{-26}$ kg for $U = 200$ V and $j = 21.6$ A/0.55 m$^2 = 39.3$ A/m$^2$. In this calculation, the lateral area of the cavity formed by the trees is fixed, with a diameter of about 0.44 m and a height of about 0.4 m, as a current-sink area of 0.55 m$^2$.

The described etching process is typically suitable for the preparation of all coatings which can be carried out in the described system. Three examples of known coating processes are given below:

(1) For the production of titanium aluminum nitride (TiAlN) using arc sources, the bias voltage is reduced and nitrogen is introduced as a process gas into the treatment space. Up to 4 arc sources 24 to 27 can then be connected up. When the full number is used, the production of a 3 mm thick TiAlN layer takes about 1 hour.

(2) For the production of a layer sequence consisting of TiAlN and titanium nitride (TiN) using arc sources, the arc source 24 is equipped with a Ti cathode and the arc source 25 is equipped with a TiAl cathode. With fast rotation of the shaft 14 and the ring 15, and slow rotation of the shaft 13, an alternating layer with sharp boundaries is obtained, even when the two arc sources are operated at the same time.

(3) For the production of a layer of molybdenum sulphide (MoS$_2$) using a cathodic sputtering source, the argon feed is maintained and a planar magnetron with an MoS$_2$ cathode is brought into use.

EXAMPLE 2

The second example describes an ion plating process, that is to say a treatment of substrates according to the invention by bombardment with noble gas ions from a low-voltage arc discharge, during coating with aluminum oxide (Al$_2$O$_3$) sputtering sources.

Four planar magnetrons with aluminum cathodes are used as the cathodic sputtering sources.

The substrates, substrate support, pumps and etching correspond to the description in the first example. The change from etching to ion plating is carried out as gradually as possible: the anode current of 280 A, the argon introduction rate of 0.133 Pa×m$^3$/s, and the argon partial pressure of 0.127 Pa produced in this way, are maintained.

Alteration to the substrate bias voltage: the voltage of the supply unit 21 is pulsed with a mean frequency of, for example, 10 KHz, and the amplitude is reduced to 20 V.

Alteration to the gas feed: for the production of oxides, oxygen gas is introduced through a specially suitable hot anode 18 into the treatment space. The oxygen, already reactive as gas molecule, is additionally dissociated and excited by the gas discharge. The oxygen activated in this way reacts when it first comes into contact with a metal wall. The oxygen flow is metered in such a way that aluminum from the substrates is oxidized but, nevertheless, the cathodes of the magnetrons in the regions with high erosion remain metallic.

Together with the plasma potential which is at about +25 V, the negative substrate potential produces an average bias voltage of about 45 V. Positively charged noble gas ions diffusing out of the plasma thus impinge on the substrate with an average kinetic energy of about 45 eV. The substrate current flowing over the 12 trees in total is about 21 A.

Whether or not the known ion plating effects can be brought about uniformly over the entire surface, even in the case of three-dimensionally structured substrates, depends, as in the case of etching, on the capacity of the plasma to penetrate the geometrical structures of the substrate. For argon ions of mass $M = 40 \times 1.67 \times 10^{-27}$ kg $= 6.6 \times 10^{-26}$ kg with $U = 45$ V and $j = 21$ A/0.55 m$^2 = 38$ A/m$^2$, the Schottky-Langmuir space charge formula gives an extraction distance $d \gg 0.26$ mm.

EXAMPLE 3

The third example describes an ARIP process, that is to say a treatment of substrates according to the invention by bombardment with metal ions from a low-voltage arc evaporator during coating with TiN.

The substrates, substrate support, pumps and etching correspond to the description in the first example. The change from etching to ion plating is carried out as gradually as possible: the argon introduction rate of 0.133 Pa×m$^3$/s, and the argon partial pressure of 0.127 Pa produced in this way, are maintained.

Alteration to the electrical circuit and parameters: the voltage of the supply unit 21 is reduced to 25 V. The crucible 16 is connected up as the anode by closing the switch B, and the electrode 18 is then switched off by opening the switch A. The hot cathode 6 is grounded by connecting the output of supply unit 19 to the container. The current of low-voltage arc discharge is increased from 280 A to 420 A.

Alteration to the gas feed: for the production of TiN, nitrogen gas is introduced directly into the treatment space. The nitrogen flow is increased until, in addition to the existing argon pressure of 0.127 Pa, a nitrogen partial pressure of 0.04 Pa and therefore a total pressure of 0.167 Pa are set up. With the existing high-vacuum pump, this situation requires a nitrogen flow of about 150 sccm.

The material to be evaporated is located in the crucible 16, which has a diameter of 80 mm. In order to obtain a uniform layer thickness and temperature on the drills in all 3 stages, the crucible is moved slowly up and down in the region of the cavity 10 along the axis 2.

The low-voltage arc discharge burns between the hot cathode 6 and the material which is to be evaporated and is contained in the copper crucible 16. The plasma of the low-voltage arc discharge spreads freely inside the cavity 10 of the substrate arrangement. The arc voltage fluctuates between about 46 V (crucible up) and 60 V (crucible down). The average arc power is 420 A×53 V=22.3 kW.

The power density is 443 W/cm$^2$, that is to say considerably less than the value of 10 kW/cm$^2$ specified as a lower limit in German patent 2823876. Nevertheless, about 30 g of titanium are evaporated per hour.

Together with the plasma potential which is at about +25 V, the substrate potential of −25 V produces a bias voltage of about 50 V. Positively charged ions diffusing out of the plasma will thus impinge with an average kinetic energy of about 50 eV on the substrate. The substrate current flowing over all 12 trees varies in step with the displacement of the crucible, between about 23 A (crucible up) and 92 A (crucible down). The substrate current has a time average value of about 57.5 A. Even at the substrate current maxima of 92 A, the current on the individual trees remains less than 8 A, so that the risk of igniting sparks on the substrates still no longer arises.

Whether or not the known ion plating effects can be brought about uniformly over the entire surface, even in the case of three-dimensionally structured substrates, depends, as in the case of etching, on the capacity of the plasma to penetrate the geometrical structures of the substrate. For titanium ions of mass M=48×1.67×10$^{-27}$ kg=8×10$^{26}$ kg with U=50 V and j=57.5 A/0.55 m$^2$=105 A/m$^2$, the Schottky-Langmuir space charge formula gives an extraction distance d>>0.22 mm.

The coating phase lasts 2 hours. After the coating process has been turned off and the batch has been cooled, the container is flooded with air and then opened. On their uncovered surfaces, the drills have an about 3 mm thick TiN layer with the yellow-gold color characteristic of stoichiometric TiN (a ratio of 1:1 in terms of numbers of atoms).

The drills are subjected to a standardized test procedure. This test is carried out by drilling 24 mm deep blind holes in a 42CrMo4 table at a speed of 1592 rpm. The drills, ion-plated according to this example, are found to be better in the drilling test than the same bores which are ion-plated using the customary process according to DE 2823876. With the 3 mm thick TiN coating, it is possible to drill at least 400 holes, instead of 300, before the drill fails.

Obviously, numerous modifications and variations of the present invention are possible in light of the above teachings. It is therefore to be understood that within the scope of the appended claims, the invention may be practiced otherwise than as specifically described herein.

What is claimed is:

1. A method for treatment of substrates arranged around a cavity, using ions from a low-voltage arc discharge which extends from a hot cathode in a chamber, through an opening into a treatment space disposed around said substrates, into the cavity as far as an anode, the method including the steps of:

continuously introducing noble gas into the hot cathode chamber during operation; and providing a vacuum, sufficient for the treatment method, maintained in the treatment space by pumping, wherein a magnetic field is not used to focus plasma of the discharge which is pinched through the opening, whereby the plasma of the discharge which is pinched through the opening is not prevented from spreading in the cavity as far as the substrates.

2. The method according to claim 1, wherein, a field strength of magnetic fields whose field lines run lengthwise to the low-voltage arc discharge is less than 0.0005 tesla.

3. The method according to claim 1, further comprising the steps of:

maintaining the substrates at a negative potential relative to a floating potential thereof; and bombarding the substrates with positively charged ions from the low-voltage arc discharge.

4. The method according to claim 3, further comprising the step of:

etching the substrates by ion bombardment treatment prior to a coating thereof.

5. The method according to claim 4, further comprising the steps of:

directly after the ion bombardment treatment, evaporating cathode material from an arc source; and coating the substrates with the evaporated cathode material.

6. The method according to claim 5, further comprising the steps of:

evaporating at least two materials from a same cathode at a same time; and covering the substrates with a mixed layer of the at least two evaporated materials.

7. The method according to claim 5, further comprising the step of:

locating the arc source outside the cavity.

8. The method according to claim 7, further comprising the steps of:

using at least two arc sources, evaporating different materials therefrom; and coating the substrates with a layer sequence of the different evaporated materials.

9. The method according to claim 5, further comprising the step of:

bombarding a layer which is growing during the coating with ions from the arc source.

10. The method according to one of claim 1, further comprising the steps of:

sputtering cathode material from a cathodic sputtering source; and coating the substrates with the sputtered cathode material.

11. The method according to claim 10, further comprising the steps of:

sputtering at least two materials from a same cathode at a same time; and covering the substrates with a mixed layer of the at least two sputtered materials.

12. The method according to claim 10, further comprising the step of:

locating the cathodic sputtering source outside the cavity.

13. The method according to claim 12, further comprising the steps of:

using at least two cathodic sputtering sources, sputtering different materials therefrom; and coating the substrates with a layer sequence of the different sputtered materials.

14. The method according to claim 10, further comprising the step of:

bombarding a layer which is growing during the coating with ions from the cathodic sputtering source.

15. The method according to claim 8, further comprising the step of:

bombarding a layer which is growing during the coating with ions from the low-voltage arc discharge.

16. The method according to claim 1, further comprising the steps of:

providing a material as the anode of the low-voltage arc discharge;

bombarding the material by electrons from the low-voltage arc discharge;

heating, evaporating and ionizing the material; and coating the substrates with the material starting from the cavity.

17. The method according to claim 16, further comprising the step of:

providing a power density on a surface of the anode to be less than 10 MW/m$^2$.

18. The method according to claim 16, further comprising the step of:

bombarding a layer which is growing during the coating with ions from the low-voltage arc discharge.

19. The method according to claim 5, further comprising the step of:

for production of layers which contain atoms from the group consisting of boron, carbon, silicon, and nitrogen, feeding at least one kind of atom from the group to the treatment space as a constituent of a reactive gas.

20. The method according to claim 19, further comprising the step of:

varying a composition of layer material during the coating of the substrates.

21. A system for treatment of substrates, comprising:

a cavity;

substrate holders, arranged around an axis of the cavity, for holding the substrates;

a low-voltage arc discharge; and a hot cathode chamber;

wherein the cavity is filled, as far as the substrates, with plasma from the low-voltage arc discharge which extends through an opening of the hot cathode chamber, into a treatment space disposed around the substrate holders and into the cavity as far as an anode;

noble gas is continuously introduced into the hot cathode chamber during operation;

a vacuum, sufficient for treatment, is provided and maintained in the treatment space by pumping; and a magnetic field is not used to focus plasma of the discharge which is pinched through the opening;

whereby the plasma of the discharge which is pinched through the opening is not prevented from spreading in the cavity as far as the substrates.

22. The system according to claim 21, wherein the system does not have coils for producing a magnetic field with field lines that run axially.

23. The system according to claim 22, wherein the system includes a door, for loading and unloading, provided on a front side of a vacuum container.

24. The system according to claim 21, wherein the system includes a substrate support which consists of the substrate holders arranged in a circle around an axis symmetric cavity and which are rotatably mounted about the axis.

25. The system according to claim 24, wherein the system includes a ring which can be rotated about the axis of the substrate support, and which rotatably drives the substrate holders.

26. The system according to claim 24, wherein the system includes substrate holders with individual lines for placing the substrates at a negative potential.

27. The system according to claim 26, wherein the system includes one automatic cutout per each of the lines, which disables a line for a preselected dead time when a preselected current is exceeded.

28. The system according to claim 24, wherein the system includes at least one arc source which is fastened outside the cavity and has a cathode thereof directed outside of the substrate support.

29. The system according to claim 24, wherein the system includes at least one cathodic sputtering source which is fastened outside the cavity and has a cathode thereof outside of the substrate support.

30. The system according to claim 21, wherein the system includes at least one water-cooled copper crucible which moves parallel to the axis and which is connected as the anode.

* * * * *